United States Patent [19]
Choi

[11] Patent Number: 5,380,680
[45] Date of Patent: Jan. 10, 1995

[54] METHOD FOR FORMING A METAL CONTACT OF A SEMICONDUCTOR DEVICE

[75] Inventor: Kyeong K. Choi, Suwonsi, Rep. of Korea

[73] Assignee: Hyundai Electronics Industries Co., Ltd., Rep. of Korea

[21] Appl. No.: 138,694

[22] Filed: Oct. 19, 1993

[30] Foreign Application Priority Data

Oct. 20, 1992 [KR] Rep. of Korea ............... 1992/19287

[51] Int. Cl.⁶ .................................. H01L 21/283
[52] U.S. Cl. .................................. 437/195; 437/190; 437/192; 437/200
[58] Field of Search ............... 437/192, 195, 190, 193, 437/200

[56] References Cited

U.S. PATENT DOCUMENTS

| | | | |
|---|---|---|---|
| 4,866,009 | 9/1989 | Matsuda | 437/203 |
| 4,987,099 | 1/1991 | Flanner | 437/192 |
| 5,026,666 | 6/1991 | Hills et al. | 437/195 |
| 5,204,286 | 4/1993 | Doan | 437/195 |
| 5,210,053 | 5/1993 | Yamagata | 437/192 |
| 5,219,793 | 6/1993 | Cooper et al. | 437/195 |
| 5,223,084 | 6/1993 | Uesato et al. | 156/644 |

Primary Examiner—T. N. Quach
Attorney, Agent, or Firm—Merchant, Gould, Smith, Edell, Welter & Schmidt

[57] ABSTRACT

The present invention provides a method for forming a metal contact in a semiconductor device which improves the reliability of electric wiring by forming a double thin metal layer on the contact plug metal. This method comprises the steps of: forming a first contact hole up to the upper surface of a semiconductor substrate 1; filling a tungsten 5 in the first contact hole; depositing a first thin metal film 6 and a second thin metal film 7 on the entire structure sequentially; applying a photoresist 8 on the second thin metal film 7; forming a pattern for a second contact hole; forming the second contact hole by etching the second thin metal film 7, the first thin metal film 6 and the insulation layer 4 sequentially by using a photoresist 8 as an etch barrier; stripping the photoresist 8 and etching the second thin metal film 7; and depositing an aluminum alloy 9 on the entire structure.

3 Claims, 2 Drawing Sheets

METHOD FOR FORMING A METAL CONTACT OF A SEMICONDUCTOR DEVICE

BACKGROUND OF THE INVENTION

The present invention relates to a method for forming a metal contact of a semiconductor device, and particularly to a method for forming a metal contact to improve the reliability of an electric wiring by forming a double thin metal layer on a contact plug metal, so that it is not directly connected with a photoresist film.

Conventionally, to form contacts in contact holes having various depths in a semiconductor device, firstly a tungsten is selectively deposited on a contact hole exposing a silicon substrate or a conducting layer opened by a CVD (Chemical vapor deposition) process using $WF_6H_2$, $SiH_4$ gas, etc., and then an aluminum alloy is deposited on the entire structure. However, because the tungsten is grown from the bottom of a silicon layer or a conducting layer at the same speed irrespective of the depth of the contact hole, it is very difficult to fill completely the tungsten in a deep contact hole.

Therefore, It is known to form a deep contact hole and a shallow contact hole separately and to respectively deposit the tungsten in the contact holes.

In this method, firstly the deep contact hole is formed by means of a contact mask and a tungsten is deposited on an exposed silicon layer or an exposed conducting layer of the contact hole by a selective deposition process.

Next, the shallow contact hole is formed by means of another contact mask and then the aluminum alloy is deposited on the entire structure.

However, in the above conventional method, because a photoresist may remain on the upper part of the tungsten of the first contact hole, or a natural oxide or a tungsten oxide layer may be formed on the surface of the tungsten, there occurs the problem that contact resistance is increased.

Accordingly, it is an object of the present invention to provide a method for forming a metal contact for a semiconductor device in order to improve the reliability of electric wiring by forming a double thin metal layer on a contact plug metal, so that it is not directly connected with a residual photoresist.

THE SUMMARY OF THE INVENTION

In accordance with the present invention, a method for forming a metal contact on a semiconductor device in which an oxide layer, a polysilicon layer and an insulation layer are formed on a semiconductor substrate comprises the steps of: forming a first contact hole up to the upper surface of the semiconductor substrate; filling a tungsten in the first contact hole; depositing a first thin metal film and a second thin metal film on the entire structure sequentially; applying a photoresist on the second thin metal film; forming a pattern for a second contact hole; forming a second contact hole by etching the second thin metal film, the first thin metal film and the insulation layer sequentially by using the photoresist as an etch barrier; stripping the photoresist and etching the second thin metal film; and depositing an aluminum alloy on the entire structure.

BRIEF DESCRIPTION OF THE DRAWINGS

For understanding of the nature and objects of the invention, reference should be had to the following detailed description taken in conjunction with the accompanying drawings in which.

DETAILED DESCRIPTION OF THE INVENTION

Figure 1:
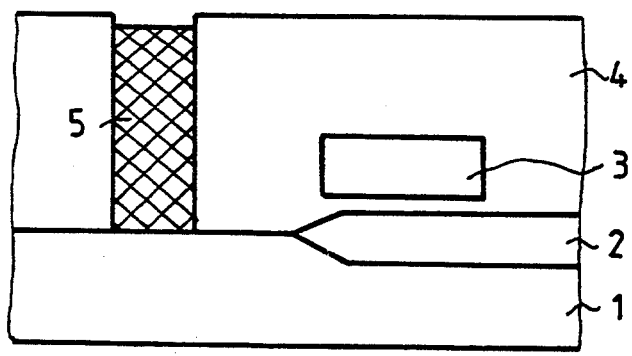
FIGS. 1 to 4 are cross sectional views illustrating the process for forming metal contacts according to the present invention.

Referring to FIG. 1, an oxide layer 2, a polysilicon layer 3 and an insulation layer 4 are formed on a semiconductor substrate 1.

Next, a first contact hole is deeply formed up to the upper surface of the semiconductor substrate 1 by etching the insulation layer 4, and then a contact plug metal, for example a tungsten 5, is filled in the first contact hole by the selective deposition method.

Figure 2:
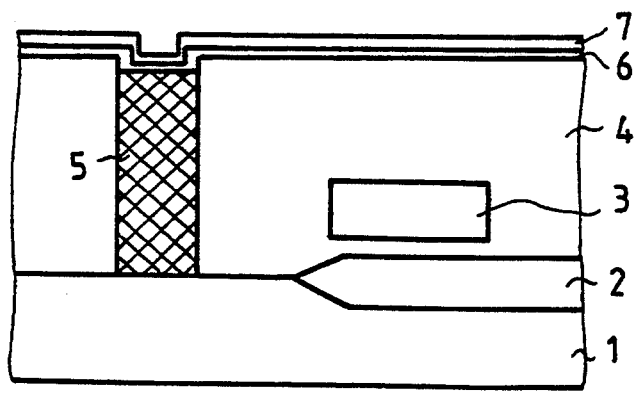

Referring to FIG. 2, by CVD method using a $TiCl_4$ or $SiH_4$ gas, a first thin film, for example, a $TiSi_2$ film 6 is deposited from 300 Å to 1,000 Å in the 300° C.–500° C. temperature range.

Next, by sputtering deposition method a second thin film, for example, a TiN film 7 is deposited on the $TiSi_2$ film 6 from 100 Å to 1000 Å.

Figure 3:
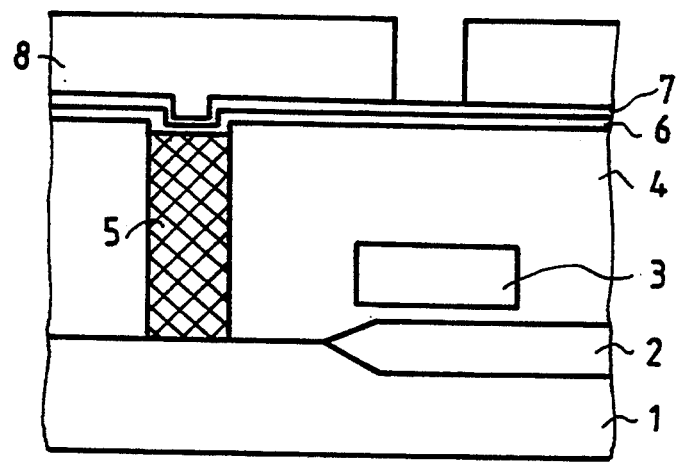

Referring to FIG. 3, a photoresist 8 is covered on the TiN film 7 in order to form a second contact hole on a polysilicon layer 3.

Figure 4:
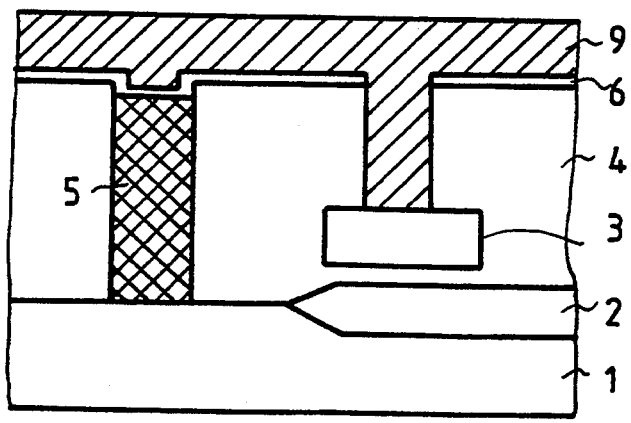

Referring to FIG. 4, the second contact hole is formed by etching the TiN film 7, the $TiSi_2$ film 6 and the insulation layer 4 sequentially, up to the upper surface of the polysilicon layer 3.

Next, the photoresist 8 is eliminated, and then the TiN film 7 is etched by a $NH_4OH$ solution, and then an aluminum alloy 9 is deposited in the second contact hole and on the entire structure.

The TiN film 7 and a residual photoresist are perfectly eliminated by the $NH_4OH$ solution but the $TiSi_2$ film 6 and the polysilicon layer 3 are not damaged by the $NH_4OH$ solution. So, the $TiSi_2$ film 6 protects the upper surface of the tungsten 5.

The present invention gives benefit to improve the reliance of an electric wiring in a semiconductor device and to protect a contact plug metal by forming a double thin metal layer on the contact plug metal.

What is claimed is:

1. A method for forming a metal contact in a semiconductor device in which at least portions of an oxide layer, a polysilicon layer and an insulation layer are formed on a semiconductor substrate, said insulation layer, said polysilicon layer, and said substrate having first, second, and third upper surfaces, respectively, comprising the steps of:

forming a first contact hole through the insulation layer to the third upper surface of the semiconductor substrate;

filling tungsten in the first contact hole;

depositing a first thin metal film and a second thin metal film sequentially on the first upper surface and the tungsten;

applying a photoresist on the second thin metal film;

forming a pattern in the photoresist for a second contact hole;

forming a second contact hole at the pattern to the second upper surface of the polysilicon layer by etching the second thin metal film and the first thin metal film and the insulation layer sequentially by using the photoresist as an etch barrier;

stripping the photoresist and etching the second thin metal film; and depositing an aluminum alloy on the first thin metal film and second contact hole.

2. The method for forming a metal contact in a semiconductor device according to claim 1, wherein said first thin metal film is a TiSi$_2$ film which is formed by a CVD process using a TiCl$_4$ or SiH$_4$ gas to the thickness of 300 Å to 1000 Å in the range of 300° C.–500° C., and wherein said second thin metal film is a TiN film which is formed by a sputtering process to the thickness of 100 Å to 1000 Å.

3. The method for forming a metal contact in a semiconductor device according to claim 1, wherein an etching solution for said second thin metal film is a NH$_4$OH solution.

* * * * *